United States Patent
Ping et al.

[11] Patent Number: 5,882,979
[45] Date of Patent: *Mar. 16, 1999

[54] METHOD FOR FORMING CONTROLLABLE SURFACE ENHANCED THREE DIMENSIONAL OBJECTS

[75] Inventors: Er-Xuan Ping; Randhir P. S. Thakur, both of Boise, Id.

[73] Assignee: Micron Technology, Inc., Boise, Id.

[*] Notice: The term of this patent shall not extend beyond the expiration date of Pat. No. 5,721,171.

[21] Appl. No.: 881,928

[22] Filed: Jun. 25, 1997

Related U.S. Application Data

[63] Continuation of Ser. No. 609,077, Feb. 29, 1996, Pat. No. 5,721,171.
[51] Int. Cl.$^6$ .................................................. H01L 21/20
[52] U.S. Cl. .................................................. 438/398
[58] Field of Search ............................................ 438/398

[56] References Cited

U.S. PATENT DOCUMENTS

| 5,385,863 | 1/1995 | Tatsumi et al. | 437/919 |
| 5,486,488 | 1/1996 | Kamiyama | 437/60 |
| 5,721,171 | 2/1998 | Ping et al. | 438/398 |

*Primary Examiner*—Brian Dutton

[57] ABSTRACT

An embodiment of the present invention develops a process for controlling the grain size of a Hemi-Spherical Grained (HSG) silicon film by the steps of: performing a controlled implant of impurities into an amorphous silicon film; providing silicon seeding sites onto the surface of the amorphous silicon film; heat treating the amorphous silicon film, impregnated with the impurities and its surface having silicon seeding sites thereon, to cause HSG formation The implanting of the impurities into the amorphous material is controlled to place the impurities at a desired depth to thereby control the grain size of the HSG silicon.

16 Claims, 2 Drawing Sheets

METHOD FOR FORMING CONTROLLABLE SURFACE ENHANCED THREE DIMENSIONAL OBJECTS

CROSS REFERENCE TO RELATED APPLICATIONS

This application is a continuation to U.S. patent application Ser. No. 08/609,077, filed Feb. 29, 1996, now U.S. Pat. No. 5,721,171.

U.S. patent application Ser. No. 08/439,022, filed May 5, 1995, now U.S. Pat. No. 5,721,171, is a related application. U.S. patent application Ser. No. 08/439,022 is hereby incorporated by reference as if set forth in its entirety.

FIELD OF THE INVENTION

This invention relates to semiconductor fabrication processing and more particularly to a process for forming controllable surface enhanced three dimensional objects from materials such as Hemi-Spherical Grain (HSG) silicon.

BACKGROUND OF THE INVENTION

The continuing trend of scaling down integrated circuits has forced the semiconductor industry to consider new techniques for fabricating precise components at sub-micron levels. Along with the need for smaller components, there has been a growing demand for devices requiring less power consumption. In the manufacture of transistors, these trends have led the industry to refine approaches to achieve thinner cell dielectric and gate oxide layers.

In dynamic semiconductor memory storage devices it is essential that storage node capacitor cell plates be large enough to retain an adequate charge (or capacitance) in spite of parasitic capacitance and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices. The ability to densely pack storage cells while maintaining required capacitance levels is a crucial requirement of semiconductor manufacturing technologies if future generations of expanded memory array devices are to be successfully manufactured.

Hemi-Spherical Grain (HSG) silicon enhances storage capacitance when used to form the storage node electrode without increasing the area required for the cell or the storage electrode height. The available methods include use of Low Pressure Chemical Vapor Deposition (LPCVD), engraving storage electrodes using poly film followed by P-diffusion utilizing $POCl_3$ source gas, a mixture of spin-on-glass (SOG), coating the polysilicon with resist and HSG formation. The size of the grain formed from these processes is somewhat random and uncontrolled. The present invention, however, develops a method to control the actual grain growth during HSG formation.

U.S. Pat. No. 5,418,180, and U.S. Pat. No. 5,407,534, contain disclosure concerning HSG formation. U.S. Pat. No. 5,418,180 and U.S. Pat. No. 5,407,534, are hereby incorporated by reference as if set forth in their entirety.

SUMMARY OF THE INVENTION

An embodiment of the present invention develops a process for forming a film comprising controllable, surface enhanced, three dimensional objects, the process comprising the steps of:

performing a controlled implant of impurities into a crystallizable amorphous material;

heat treating the amorphous material impregnated with the impurities to cause the step of forming the three dimensional objects.

Another embodiment of the present invention develops a process for forming a film comprising controllable, surface enhanced, three dimensional objects, the process comprising the steps of:

performing a controlled implant of impurities into an amorphous film; providing seeding sites onto the surface of the amorphous film;

heat treating the amorphous film, impregnated with the impurities and its surface having seeding sites thereon, to cause the formation of the film comprising controllable, surface enhanced, three dimensional objects.

Another embodiment of the present invention develops a process for controlling Hemi-Spherical Grain (HSG) formation, the process comprising the steps of:

performing a controlled implant of impurities into an amorphous silicon film;

providing silicon seeding sites onto the surface of the amorphous silicon film;

heat treating the amorphous silicon film, impregnated with the impurities and its surface having silicon seeding sites thereon, to cause HSG formation.

DETAILED DESCRIPTION OF THE PREFERRED EMBODIMENTS

The present invention is directed to a process for forming a film comprising controllable, surface enhanced, three dimensional objects, such as Hemi-Spherical Grain (HSG) films. General embodiments are depicted in the process steps of FIGS. 1 and 2.

Figure 1:
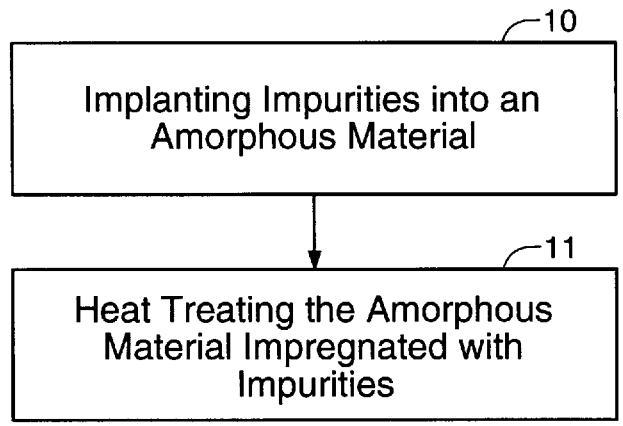
FIG. 1 is a process flow diagram of a general embodiment of the present invention.

Referring now to FIG. 1, in step 10, a controlled implant is performed so that impurities are placed at a desired depth into an amorphous material. The amorphous material must be a material that can be crystallized and the impurities may be any impurity type, such as a dopant to enhance the conductivity or an atom to change the local structure. Once the impurities are implanted the amorphous material impregnated with impurities is subjected to a heat treatment step (by rapid thermal annealing or by a conventional furnace) which causes the amorphous material to crystallize and form three dimensional objects on the surface of the amorphous material, the size of which are controlled by the depth the impurities, are positioned into the amorphous material. Basically, the deeper the impurity penetrates the amorphous material, the larger the size of the three dimensional objects formed on the surface of the amorphous material. Conversely, the shallower the impurity, the smaller the size of the three dimensional objects formed on the surface of the amorphous material. Thus the present invention provides a method of forming controllable, surface enhanced, three dimensional objects on an amorphous material, such as hemispherical grain (HSG) material. The process steps may be performed either in-situ or ex-situ. However, if the process is ex-situ then it is desirable to clean the surface of the amorphous silicon film prior to the heat treatment step.

As mentioned, a specific example of controllable, surface enhanced, three dimensional objects can be formed on such films as Hemi-Spherical Grain (HSG) films formed from amorphous silicon. The controlled implant comprises implanting the impurities into the amorphous material at a desired depth to thereby control the size of the controllable, surface enhanced, three dimensional objects created during HSG silicon formation. The implanting conditions are sufficient to place the impurities at a desired depth to obtain the desired grain size of the HSG silicon. The implanting conditions include the energy and the dose, which change the depth of the ion and amount of ions at that depth, respectively.

For example, the controlled implant may be a n or p type species implant which comprises implanting these impurities into an amorphous silicon film that is approximately 500 Å thick. The n or p type impurities are implanted at an energy of approximately 100 keV and from a dose of $5.0e13$ $cm^{-2}$ to $5.0e16$ $cm^{-2}$ n or p type ions. The step of heat treating is accomplished by performing an annealing step at a temperature ranging from approximately 560° C. to 570° C.

Figure 2:
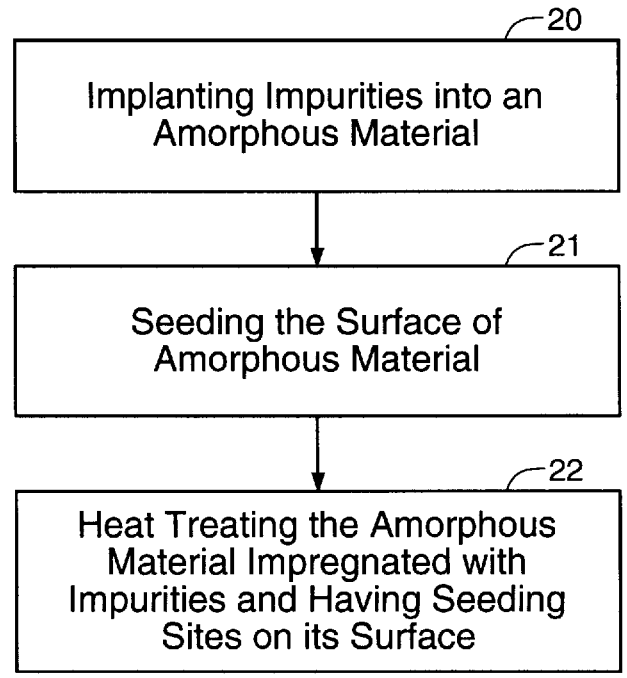
FIG. 2 is a process flow diagram of a second general embodiment of the present invention.

In a second embodiment and referring now to FIG. 2, a process for forming a film comprising controllable, surface enhanced, three dimensional objects is described. During step 20, a controlled implant of impurities into a crystallizable amorphous material is performed. During step 21, seeding sites of a material that is chemically similar to the amorphous material, are placed onto the surface of the amorphous material. Then during step 22, the amorphous material, impregnated with impurities and its surface having seeding sites thereon, is subjected to heat treatment (by rapid thermal annealing or by a conventional furnace). The heat treatment step causes the formation of the three dimensional objects onto the surface of the amorphous material. As in the first general embodiment, the amorphous material must be a material that can be crystallized. However, now the formation of the three dimensional objects is dependent not only on the depth of the impurities in the amorphous layer, but also the distribution of the seeding sites formed on the surface of the amorphous material, prior to the heat treatment step. This concept is further demonstrated in FIGS. 3A–3C.

Figure 3A:
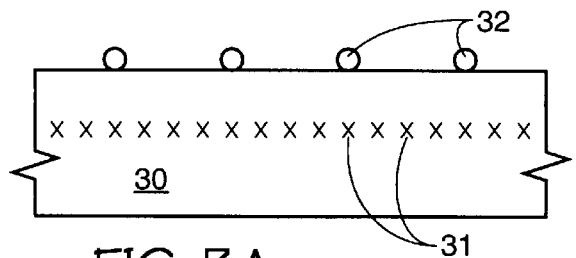
FIGS. 3A, 3B, and 3C are cross-sectional views of an in-process wafer portion demonstrating the results of the process steps as outlined in FIG. 2.

Referring now to FIG. 3A, an amorphous material 30 has been implanted with impurities 31. The depth and the amount of the implant is controlled by implanting conditions, impurity dose, implant energy and temperature. Seeding sites 32 are deposited atoms of a material that is chemically similar to amorphous material 30. The 32 seeding sites are created by controlled variations of CVD temperature, pressure and deposition period.

Figure 3B:
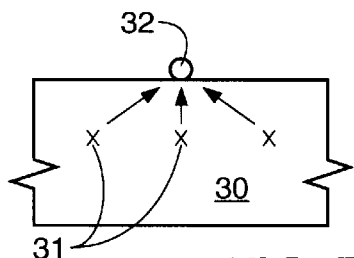

FIG. 3B demonstrates the formation of the controllable, surface enhanced, three dimensional objects during the heat treatment step as the atoms 31 in the amorphous material 30, mostly above the depth of implantation migrate towards the nearest seeding site 32.

Figure 3C:
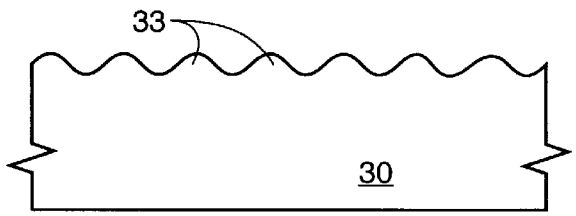

As shown in FIG. 3C, after the heat treatment step is performed, controllable, surface enhanced, three dimensional objects are created as indicated by the rugged surface of film 33. As mentioned in a general embodiment, the size of the three dimensional objects (or ruggedness of film 33) is now determined by the depth of impurities 31 and the distribution of seeding sites 32.

As a specific example for practicing the present invention a Hemi-Spherical Grain (HSG) film comprising controllable, surface enhanced, three dimensional objects, is formed by:

performing a controlled implant of impurities into an amorphous silicon providing silicon seeding sites onto the surface of the amorphous silicon film;

heat treating the amorphous silicon film, impregnated with impurities and its surface having silicon seeding sites thereon, to cause HSG film formation.

In the example presented, the amorphous silicon film that is approximately 500 Å thick. N or p type impurities are implanted at an energy of approximately 100 keV and from a dose of $5.0e13$ $cm^{-2}$ $5.0e16$ $cm^{-2}$ ions. Seeding sites 32 comprise silicon atoms deposited by Chemical Vapor Deposition (CVD) from a silicon source gas, such as $SiH_4$ diluted with $N_2$. Then the amorphous silicon layer, impregnated with n or p type impurities and its surface having seeding sites deposited thereon, is subjected to an annealing step (by rapid thermal annealing or by a conventional furnace) at a temperature ranging from approximately 560° C. to 570° C. The annealing of the amorphous silicon causes nucleation sites to form about the silicon seeding sites as the silicon atoms, mostly above the depth of the implantation, migrate toward the nearest silicon seeding site 32. This results in the formation of an HSG silicon film which has a controllable, rugged surface.

Figure 4:
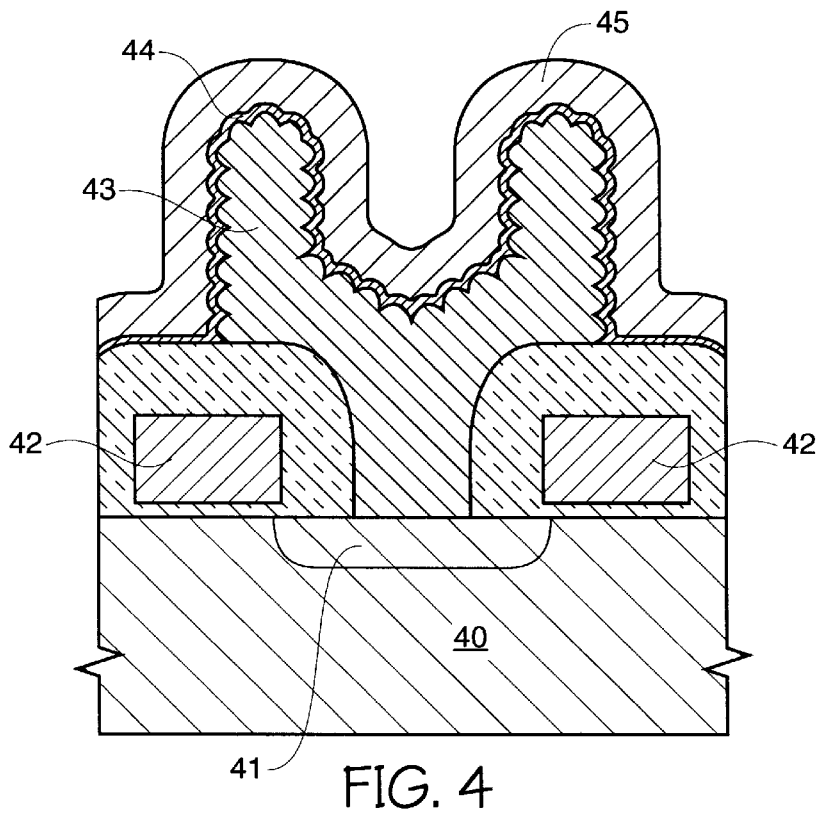
FIG. 4 is a cross-sectional view of a wafer portion depicting a specific application of the present invention.

From the general embodiments described a specific application is depicted in FIG. 4 which shows the forming of a capacitor electrode comprising a Hemi-Spherical Grain (HSG) silicon film. Access gates 42 have been formed on silicon substrate 40. Diffusion region 41 has been formed into substrate 40 and spans between gates 42. A capacitor electrode structure 43 connects to diffusion 41. As shown capacitor electrode 43 has a rugged surface that is formed in light of the present invention.

First, an amorphous silicon film is formed on at least a portion of capacitor electrode structure 43. Next a controlled implant is performed to place conductive impurities at a desired depth into the amorphous silicon film. Next, silicon seeding sites are formed adjacent the surface of the amorphous silicon film. At this point, the amorphous silicon film is impregnated with conductive impurities and silicon seeding sites are distributed about the amorphous silicon film's surface. With the amorphous silicon film in this stage it is subjected to a heat treatment step (by rapid thermal annealing or by a conventional furnace) which causes HSG silicon film formation as depicted by the rugged surface of capacitor electrode 43. The process steps may be performed either in-situ or ex-situ. However, if the process is ex-situ then it is desirable to clean the surface of the amorphous silicon film prior to the heat treatment step.

The preferred controlled implant will accomplish implanting impurities into the amorphous silicon film at a desired depth in order to control the size of the grains formed during said HSG formation. In the above specific application, an implant is performed whereby n or p type impurities are implanted into an amorphous silicon that is approximately 500 Å thick at an energy of approximately 100 keV and from a dose of $5.0e13$ $cm^{-2}$ to $5.0e16$ $cm^{-2}$ n or p type ions. During the heat treatment step, an annealing step (by rapid thermal annealing or by a conventional face) is performed at temperature ranging from approximately 560° C. to 570° C. The capacitor is completed by forming capacitor dielectric 44 adjacent the rugged surface of capacitor electrode. structure 43 and then forming a second capacitor electrode 45 over dielectric 44.

It is to be understood that although the present invention has been described with reference to a preferred embodiment, various modifications, known to those skilled in the art, may be made to the structures and process steps presented herein without departing from the invention as recited in the several claims appended hereto.

What is claimed is:

1. A process for controlling Hemi-Spherical Grain (HSG) formation, said process comprising the steps of:
   performing a controlled implant of impurities into an amorphous silicon film;
   providing silicon seeding sites onto the surface of said amorphous silicon film;
   after said steps of performing a controlled implant and providing silicon seeding sites, heat treating said amorphous silicon film to cause said HSG formation;
   wherein said process steps are performed ex-situ.

2. The process as recited in claim 1, wherein the surface of said amorphous silicon film is cleaned prior to said step of heat treating.

3. The process as recited in claim 1, wherein said step of performing a controlled implant comprises implanting said impurities into said amorphous silicon film at a depth to thereby control the size of the grains formed during said HSG formation, wherein the implanting conditions are sufficient to place said impurities at said depth.

4. The process as recited in claim 3, wherein said controlled implant comprises n or p type implantation.

5. The process as recited in claim 4, wherein said n or p type implantation comprises implanting n or p type impurities into said amorphous silicon film at an energy of approximately 100 keV and from a dose of 50e13 cm$^{-2}$ to 5.0e16 cm$^{-2}$ n or p type ions.

6. The process as recited in claim 1, wherein said step of heat treating comprises an annealing step performed at temperature ranging from approximately 560° C. to 570° C.

7. The process as recited in claim 1, wherein said step of heat treating comprises a rapid thermal anneal.

8. The process as recited in claim 1, wherein said step of heat treating comprises a furnace anneal.

9. A process for forming a capacitor electrode comprising a Hemi-Spherical Grain (HSG) silicon film, said process comprising the steps of:
   forming an amorphous silicon film on at least a portion of a capacitor electrode structure;
   performing a controlled implant of impurities into an amorphous silicon film;
   providing silicon seeding sites onto the surface of said amorphous silicon film;
   after said steps of performing a controlled implant and providing silicon seeding sites, heat treating said amorphous silicon film to cause said HSG formation;
   wherein said process steps are performed ex-situ.

10. The process as recited in claim 9, wherein the surface of said amorphous silicon film is cleaned prior to said step of heat treating.

11. The process as recited in claim 10, wherein said step of performing a controlled implant comprises implanting said impurities into said amorphous silicon film at a depth to thereby control the size of the grains formed during said HSG formation, wherein the implanting conditions are sufficient to place said impurities at said depth.

12. The process as recited in claim 11, wherein said controlled implant comprises n or p type implantation.

13. The process as recited in claim 12, wherein said n or p type implantation comprises implanting n or p type impurities into said amorphous silicon film at an energy of approximately 100 keV and from a dose of 5.0e13 cm$^{-2}$ to 5.0e16 cm$^{-2}$ n or p type ions.

14. The process as recited in claim 9, wherein said step of heat treating comprises an annealing step performed at temperature ranging from approximately 560° C. to 570° C.

15. The process as recited in claim 9, wherein said heat step of heat treating comprises a rapid thermal anneal.

16. The process as recited in claim 9, wherein said heat step of heat treating comprises a furnace anneal.

* * * * *